United States Patent [19]

Sanwo et al.

[11] Patent Number: 4,968,905

[45] Date of Patent: Nov. 6, 1990

[54] TEMPERATURE COMPENSATED HIGH SPEED ECL-TO-CMOS LOGIC LEVEL TRANSLATOR

[75] Inventors: Ikuo J. Sanwo, San Marcos; Gregory H. Milby, San Diego; Quynh-Giao X. Le, Escondido, all of Calif.

[73] Assignee: NCR Corporation, Dayton, Ohio

[21] Appl. No.: 398,856

[22] Filed: Aug. 25, 1989

[51] Int. Cl.⁵ ............................................. H03K 17/14
[52] U.S. Cl. .................................. 307/475; 307/443; 307/451; 307/310; 323/907
[58] Field of Search ............. 307/443, 448, 451, 455, 307/475, 494, 264, 310; 323/907

[56] References Cited

U.S. PATENT DOCUMENTS

| | | | |
|---|---|---|---|
| 4,242,604 | 12/1980 | Smith | 307/443 |
| 4,393,315 | 7/1983 | Stickel et al. | 307/264 |
| 4,437,171 | 3/1984 | Hudson et al. | 365/177 |
| 4,453,095 | 6/1984 | Wrath et al. | 307/475 |
| 4,533,842 | 8/1985 | Yang et al. | 307/475 |
| 4,563,601 | 1/1986 | Asano et al. | 307/475 |
| 4,599,521 | 7/1986 | Kanai et al. | 307/455 |
| 4,656,375 | 4/1987 | Lauffer et al. | 307/443 X |
| 4,698,526 | 10/1987 | Allan | 307/475 |
| 4,717,836 | 1/1988 | Doyle | 307/310 |
| 4,717,847 | 1/1988 | Nolan | 307/475 |
| 4,719,372 | 1/1988 | Chappell et al. | 307/475 |
| 4,736,125 | 4/1988 | Yuen | 323/907 X |
| 4,763,021 | 8/1988 | Stickell | 307/475 |
| 4,767,951 | 8/1988 | Cornish et al. | 307/475 |
| 4,841,175 | 6/1989 | De Man et al. | 307/451 X |
| 4,849,660 | 7/1989 | Hayashi et al. | 307/443 X |
| 4,906,871 | 3/1990 | Iida | 307/475 |

Primary Examiner—David Hudspeth
Attorney, Agent, or Firm—Wilbert Hawk, Jr.; Stephen F. Jewett; Gregory P. Gadson

[57] ABSTRACT

An emitter coupled logic (ECL)-to-complementary metal-oxide-semiconductor (CMOS) logic level translator is temperature compensated to track temperature induced shifts in the ECL logic levels. The translator includes a differential amplifier with mid-range reference voltage. A reference voltage generator supplies the reference voltage to the differential amplifier and has a temperature sensitive transistor which changes the value of the circuit output (reference) voltage ambient with temperature shifts.

10 Claims, 3 Drawing Sheets

TEMPERATURE COMPENSATED REFERENCE VOLTAGE ( $V_{REF}$ ) GENERATOR

1

TEMPERATURE COMPENSATED HIGH SPEED ECL-TO-CMOS LOGIC LEVEL TRANSLATOR

FIELD OF THE INVENTION

The present invention generally relates to logic level translators, and more specifically to emitter coupled logic (ECL)-to-complementary metal-oxide-semiconductor (CMOS) logic level translators (ECL-to-CMOS logic level translators).

BACKGROUND OF THE INVENTION

Present day computer systems often contain circuitry having more than one logic family to achieve advantages associated with the families used. For example, ECL circuits, which are generally faster than CMOS circuits, have higher price and lower densities associated therewith. Good circuit design which includes both ECL and CMOS circuitry uses each logic family where its advantages are greatest when considering the design criteria.

ECL circuits have logic low levels of approximately −1.7 volts, and logic high levels of approximately −0.9 volts. In contrast, the CMOS logic low voltage level is approximately −5.2 volts and the logic high voltage level is approximately 0 volts. Therefore, when coupling an ECL circuit to a CMOS circuit, the ECL logic levels must be translated to the CMOS logic levels.

It has been observed that ECL circuitry is sensitive to ambient temperature, so that ECL logic levels are temperature dependent. Because of temperature-induced shifts in logic levels, prior art logic level translators must operate with a smaller than desirable noise margin, resulting in reduced performance.

SUMMARY OF THE INVENTION

It is an object of the present invention to provide an ECL-to-CMOS logic level translator that compensates for temperature-induced shifts in the ECL logic level in order to improve performance and noise margins.

It is also an object of the present invention to meet the above object by providing an internal temperature compensated reference voltage generator which generates a reference voltage for a logic level shifter, thus obviating the need for prior art external power supplies.

It is yet another object of the present invention to implement an ECL-to-CMOS logic level translator meeting the above objects in a single semiconductor chip.

There is provided in accordance with the present invention an ECL-to-CMOS logic level translator including inter alia, a translator input for receiving an input ECL signal, a translator output, a logic level shifter coupled at its input to the translator input and coupled at its output to the translator output for translating the input ECL signal to an output CMOS signal, and temperature compensating means coupled to the logic level shifter for temperature compensating the output of the shifter.

The details of the present invention will be revealed in the following description with reference to the aforementioned drawings.

DESCRIPTION OF THE PREFERRED EMBODIMENT

Figure 1:
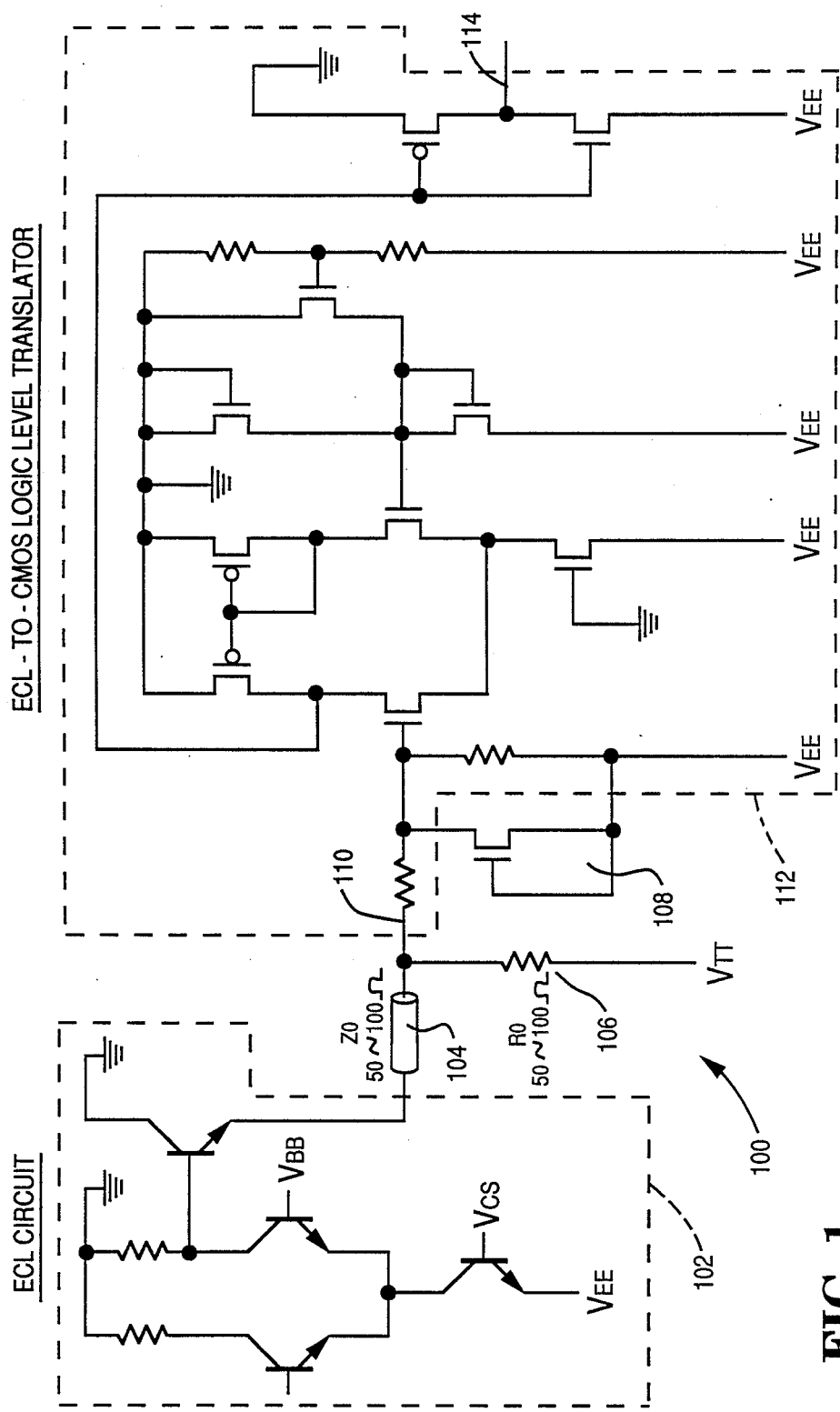
FIG. 1 is a schematic diagram of the present inventive ECL-to-CMOS logic level translator connected at its input to an ECL circuit.

The arrangement 100 in FIG. 1 is a combination of an ECL circuit 102 (evidenced by its bipolar junction transistors) coupled to and ECL-to-CMOS logic level translator 112 (evidenced by its junction field-effect transistors, with a bubble at the gate indicating a p-channel device, and the absence of a bubble at the gate indicating an n-channel device). The ECL circuit 102 outputs ECL signals over a transmission medium 104, which transmission medium is impedance matched with a resistor 106 (connected to a power source VTT of −2.0 volts) for a maximum signal transfer rate. An input line 110 carries the ECL signals from the transmission medium 104 to the ECL-to-CMOS logic level translator 112, which translates the ECL signals received into CMOS signals to be output at 114. The arrangement 100 also contains a circuit 108 for electro-static discharge in order to protect the input to the logic level translator 112 from electro-static charges. The transistor in the circuit 108 is configured such that it provides low and high voltage electro-static discharge.

Figure 2:
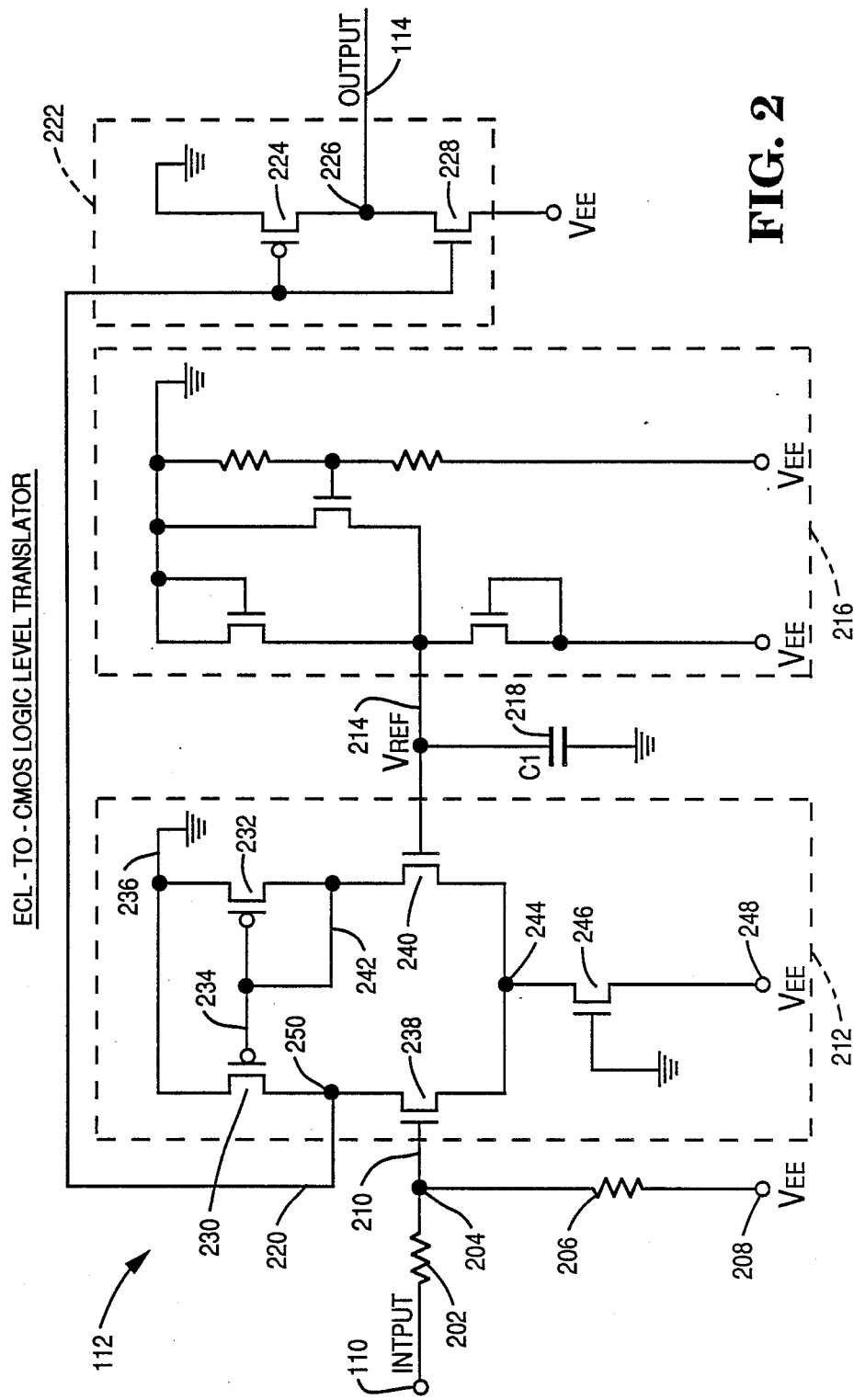
FIG. 2 is a schematic diagram of the present inventive ECL-to-CMOS logic level translator.

FIG. 2 shows the logic level translator 112 in greater detail. The input 110 for inputting the ECL signals connects a resistor 202, which resistor 202 is connected via node 204 to translator input 210, and to a resistor 206, the resistor 206 being connected to a power source $V_{EE}$ of approximately −5.2 volts. The translator input 210 supplies the input ECL signal to a differential amplifier 212 which has a reference voltage $V_{REF}$ supplied thereto via line 214 by a temperature compensated reference voltage generator 216. The reference voltage supplied is −2.5 volts at room temperature and is adjusted at a rate of 1 millivolt per degree Celsius. The temperature compensated reference voltage generator 216 will be described in greater detail infra, with reference to FIG. 3.

A grounded capacitor 218 maintains a steady reference voltage on line 214 when there are unacceptable fluctuations in $V_{EE}$. A differential amplifier output line 220 connected to differential amplifier output node 250 introduces a differential output signal to an inverter/gate 222, which inverts the signal received to approximately 0 volts when the signal is below a threshold (−2.5 volts), and inverts the signal received to approximately −5.2 volts when the signal is above the threshold. The inverter/gate 222 passes inverted signals to the translator output line 114, which signals are now at CMOS logic levels.

The differential amplifier 212 is of the type well-known in the art, and thus will be described only briefly. Having an amplification factor of approximately 10, the differential amplifier 212 has load transistors 230 and 232 whose sources are tied to ground, and which are connected at their gates by line 234. The gates of transistors 230 and 232 are also connected via line 242 to the drains of the transistors 232 and 240. The input transistors 238 and 240 are connected via node 244 to a constant current-source consisting of a transistor 246 having its gate connected to ground, and which is connected at its source to power source $V_{EE}$. The output of the differential amplifier 212 is carried by a line 220, inverted by the inverter 222, and is finally output at 114.

The logic level translator 112 briefly operates as follows. When a logic high ECL signal is applied to the translator input 110, the resistor 202 shifts that voltage to approximately −2.2 volts at node 204. This turns the transistor 238 on and pulls the line 220 down near −4.0 volts. The voltage on line 220 turns on transistor 224 in the inverter/gate 222 and pulls the output node 226 up to 0 volts. The voltage on line 220 also turns the transistor 228 off at this time. When a logic low ECL signal is applied to the translator input 110, the resistor 202 shifts that voltage to approximately −2.8 volts at node 204, turning the transistor 238 off and placing approximately −1.0 volt on the line 220. This turns the transistor 224 off and the transistor 228 on. The transistor 228 passes the voltage $V_{EE}$ to the output node 226 of the inverter/gate 222.

Thus, the voltages transferred to the output 114 are approximately 0 and −5.2 volts.

Figure 3:
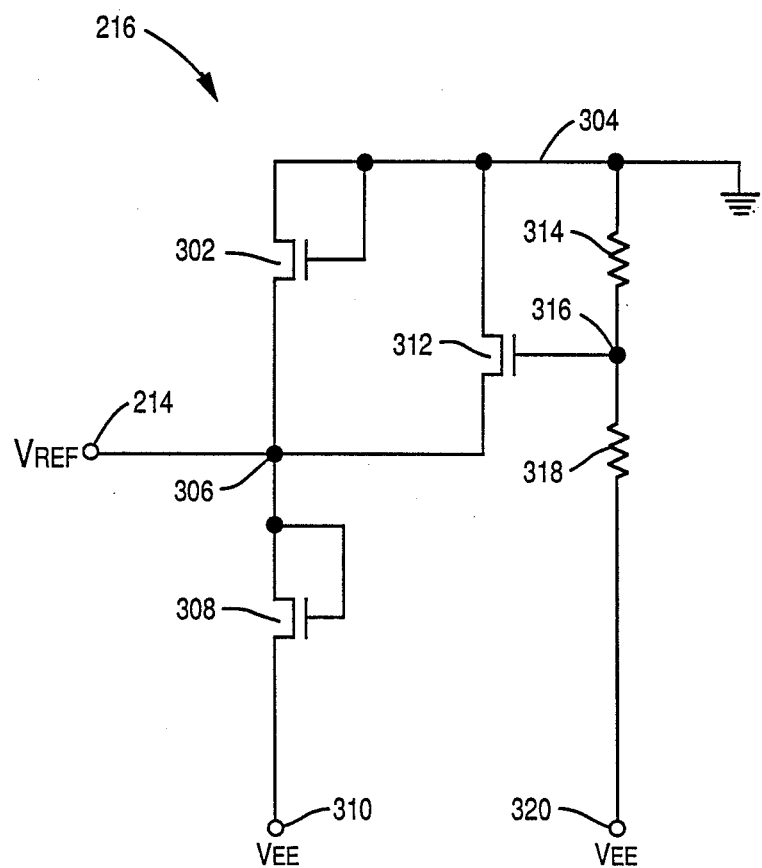
FIG. 3 is a schematic diagram of a temperature compensated reference voltage generator present in the aforementioned ECL-to-CMOS logic level translator.

The temperature compensated reference voltage generator 216 is detailed in FIG. 3. Transistors 302 (attached to ground via line 304) and 308 (attached to the power source VEE at 310) are chosen such that they place a voltage of −2.5 volts on node 306 at room temperature (25° C. or 77° F.). A transistor 312 is connected to the node 306 at its source and to ground at its drain. The gate of the transistor 312 is connected via node 316 to a constant voltage source generated by the pair of resistors 314 and 318 (connected to power source VEE at 320). The transistor 312 is temperature sensitive, and conducts in proportion to the ambient temperature to raise (make it more positive) the voltage at node 306 with increasing temperature. The transistor 312 increases the reference voltage at node 306 at a rate of 1 millivolt per degree Celsius. The increasing pulling effect with temperature in transistor 312 is due to a decrease in its threshold voltage with increasing temperature.

Variations and modifications to the present invention are possible given the above disclosure. However, such variations and modifications are intended to be within the scope of the invention claimed by this letters patent.

We claim:

1. An emitter coupled logic (ECL)-to-complementary metal-oxide-semiconductor (CMOS) logic level translator comprising:
   a translator input coupled to receive an input ECL signal;
   a translator output;
   a logic level shifter coupled at its input to said translator input and coupled at its output to said translator output for translating said input ECL signal to an output CMOS signal; and
   temperature compensating means coupled to said logic level shifter for temperature compensating the output of said shifter;
   wherein said logic level shifter comprises a differential amplifier having a reference voltage input coupled to said temperature compensating means, said temperature compensating means supplying the reference voltage.

2. The logic level translator in claim 1 wherein said temperature compensating means comprises a temperature compensation transistor coupled to the output of said temperature compensating means for adjusting the output of said temperature compensating means in accordance with temperature changes.

3. The logic level translator in claim 1 further comprising a capacitor coupled between said logic level shifter and said temperature compensating means for stabilizing the reference voltage supplied to said logic level shifter.

4. The logic level translator in claim 1 further comprising a capacitor coupled between said logic level shifter and said temperature compensating means for stabilizing the reference voltage supplied to said logic level shifter, and wherein said temperature compensating means comprises a temperature compensation transistor coupled to the output of said temperature compensating means for adjusting the output of said temperature compensating means in accordance with temperature changes.

5. The logic level translator in claim 4 further comprising a capacitor coupled between said logic level shifter and said temperature compensating means for stabilizing the reference voltage supplied to said logic level shifter.

6. The logic level translator in claim 1 wherein said translator output comprises an inverter for outputting an inverted form of a signal received from said logic level shifter.

7. The logic level translator in claim 2 wherein said translator output comprises an inverter for outputting an inverted form of a signal received from said logic level shifter.

8. The logic level translator in claim 3 wherein said translator output comprises an inverter for outputting an inverted form of a signal received from said logic level shifter.

9. The logic level translator in claim 4 wherein said translator output comprises an inverter for outputting an inverted form of a signal received from said logic level shifter.

10. The logic level translator in claim 5 wherein said translator output comprises an inverter for outputting an inverted form of a signal received from said logic level shifter.

* * * * *